United States Patent
Hsu et al.

(10) Patent No.: US 10,604,651 B1
(45) Date of Patent: Mar. 31, 2020

(54) RESIN COMPOSITION AND ARTICLE MADE THEREFROM

(71) Applicant: Elite Material Co., Ltd., Taoyuan (TW)

(72) Inventors: Ching-Hsien Hsu, Taoyuan (TW); Kok-Sheng Tan, Taoyuan (TW)

(73) Assignee: ELITE MATERIAL CO., LTD., Taoyuan (TW)

( * ) Notice: Subject to any disclaimer, the term of this patent is extended or adjusted under 35 U.S.C. 154(b) by 6 days.

(21) Appl. No.: 16/206,511

(22) Filed: Nov. 30, 2018

(30) Foreign Application Priority Data

Oct. 4, 2018 (TW) .............................. 107135003 A

(51) Int. Cl.
*C08L 71/12* (2006.01)
*H05K 1/03* (2006.01)
*C08G 65/48* (2006.01)
*C08K 3/013* (2018.01)
*C08K 5/00* (2006.01)
*H01B 3/42* (2006.01)

(52) U.S. Cl.
CPC .......... *C08L 71/126* (2013.01); *C08G 65/485* (2013.01); *C08K 3/013* (2018.01); *C08K 5/0025* (2013.01); *H01B 3/427* (2013.01); *H05K 1/0373* (2013.01); *C08G 2650/36* (2013.01); *C08L 2203/206* (2013.01)

(58) Field of Classification Search
CPC ........ C08G 65/00; C08G 65/34; C08G 65/48; C08G 65/485; C08G 2650/36; C08K 5/0025; C08K 3/013; C08L 71/126; C08L 2203/206; H01B 3/427; H05K 1/0373
See application file for complete search history.

(56) References Cited

U.S. PATENT DOCUMENTS

| 2016/0185904 A1* | 6/2016 | Gao | C08L 71/126 |
| | | | 524/508 |
| 2017/0260364 A1* | 9/2017 | Hsieh | C08K 5/53 |
| 2019/0292326 A1* | 9/2019 | Chang | C08F 12/34 |

OTHER PUBLICATIONS

SABIC PPE Reactive Chemistries SA9000 Technical Data Sheet, Mar. 30, 2018. (Year: 2018).*

* cited by examiner

*Primary Examiner* — Christopher M Rodd
(74) *Attorney, Agent, or Firm* — Muncy, Geissler, Olds & Lowe, P.C.

(57) ABSTRACT

A resin composition and an article made from the resin composition are disclosed. The resin composition comprises: a first vinyl-containing polyphenylene oxide resin, a prepolymer thereof or both; and a second vinyl-containing polyphenylene oxide resin or a prepolymer thereof; wherein the first vinyl-containing polyphenylene oxide resin has a number average molecular weight of between 500 and 1500, and the second vinyl-containing polyphenylene oxide resin has a number average molecular weight of between 1600 and 3500.

14 Claims, No Drawings

RESIN COMPOSITION AND ARTICLE MADE THEREFROM

CROSS-REFERENCE TO RELATED APPLICATION

This application claims the priority benefits of Taiwan Patent Application No. 107135003, filed on Oct. 4, 2018. The entirety the above-mentioned patent application is hereby incorporated by reference herein and made a part of this specification.

BACKGROUND

1. Field of the Disclosure

The present disclosure relates to a resin composition and more particularly to a resin composition comprising at least two vinyl-containing polyphenylene oxide resins with different molecular weight, which is used for making a prepreg, a resin film, a resin film with copper foil, a laminate or a printed circuit board.

2. Description of Related Art

With the rapid advancement of electronic technology, information processing in mobile communication, servers, cloud storage and other electronic products has been incessantly directed toward high frequency signal transmission and high speed digitalization, and low dielectric resin material has become the mainstream for the development of laminates for high speed data transmission in order to satisfy the demands of high speed information transmission. The major requirements of resin materials such as copper-clad laminates include several aspects such as low dielectric constant (Dk), low dissipation factor (Df), high reliability, high thermal resistance after moisture absorption and high dimensional stability. Therefore, there is a need for developing materials suitable for a high performance printed circuit board.

Compared with other resin materials, polyphenylene oxide resins (PPO resins), also known as polyphenylene ether resins (PPE resins), are widely used in high frequency low dielectric printed circuit boards due to their low dielectric constant and low dissipation factor. However, currently available polyphenylene oxide resins fail to perform well in dimensional stability, so there is a need to propose a polyphenylene oxide resin composition capable of achieving satisfactory dimensional stability.

SUMMARY

A primary object of the present disclosure is to provide a resin composition, comprising: a first vinyl-containing polyphenylene oxide resin, a prepolymer thereof or both; and a second vinyl-containing polyphenylene oxide resin or a prepolymer thereof; wherein the first vinyl-containing polyphenylene oxide resin has a number average molecular weight of between 500 and 1500, and the second vinyl-containing polyphenylene oxide resin has a number average molecular weight of between 1600 and 3500.

In one embodiment, the resin composition comprises 5 to 80 parts by weight of the first vinyl-containing polyphenylene oxide resin, a prepolymer thereof or both; and 5 to 80 parts by weight of the second vinyl-containing polyphenylene oxide resin or a prepolymer thereof. In another embodiment, the resin composition comprises 10 to 50 parts by weight of the first vinyl-containing polyphenylene oxide resin and 10 to 80 parts by weight of the prepolymer of the second vinyl-containing polyphenylene oxide resin; or 10 to 50 parts by weight of the second vinyl-containing polyphenylene oxide resin and 10 to 80 parts by weight of the prepolymer of the first vinyl-containing polyphenylene oxide resin.

In one embodiment, at least one of the first vinyl-containing polyphenylene oxide resin and the second vinyl-containing polyphenylene oxide resin is present as a prepolymer. For example, the prepolymer is formed by prepolymerization of the first vinyl-containing polyphenylene oxide resin or the second vinyl-containing polyphenylene oxide resin and any one or more of a cyanate ester resin, a small molecule vinyl compound, a maleimide resin, an acrylate and a polyolefin.

In one embodiment, the first vinyl-containing polyphenylene oxide resin comprises a vinylbenzyl-containing polyphenylene oxide resin, and the second vinyl-containing polyphenylene oxide resin comprises a vinylbenzyl-containing polyphenylene oxide resin, a methacrylate-containing polyphenylene oxide resin, an allyl-containing polyphenylene oxide resin, a vinylbenzyl-modified bisphenol A polyphenylene oxide resin, a chain-extended vinyl-containing polyphenylene oxide resin or a combination thereof. In one embodiment, the first vinyl-containing polyphenylene oxide resin has a number average molecular weight of between 800 and 1400, and the second vinyl-containing polyphenylene oxide resin has a number average molecular weight of between 1800 and 3000.

In one embodiment, in addition to the first vinyl-containing polyphenylene oxide resin (and/or a prepolymer thereof) and the second vinyl-containing polyphenylene oxide resin (or a prepolymer thereof), the resin composition disclosed herein may further comprise: an epoxy resin, another polyphenylene oxide resin, a cyanate ester resin, a small molecule vinyl compound, a maleimide resin, a phenolic resin, a benzoxazine resin, a styrene maleic anhydride, a polyolefin, a polyester resin, an amine curing agent, a polyamide resin, a polyimide resin or a combination thereof. In another embodiment, the resin composition disclosed herein further comprises the following ingredient: flame retardant, inorganic filler, curing accelerator, solvent, silane coupling agent, coloring agent, toughening agent or a combination thereof.

The resin compositions of various embodiments may be used for making different articles, including but not limited to a prepreg, a resin film, a resin film with copper foil, a laminate or a printed circuit board.

Surprisingly, by the use of at least two vinyl-containing polyphenylene oxide resins with different molecular weight, the present disclosure achieves significant improvements in the following one or more or all aspects: a coefficient of thermal expansion of less than 35.0 ppm/° C. as measured with a thermomechanical analyzer by reference to IPC-TM-650 2.4.24.5; a T288 thermal resistance as measured by reference to IPC-TM-650 2.4.24.1 of greater than or equal to 70 minutes; an interlayer bonding strength as measured by reference to IPC-TM-650 2.4.8 of greater than or equal to 2.85 lb/in; and a Z-axis dimensional change ratio as measured by reference to IPC-TM-650 2.4.24.5 of less than or equal to 1.80%.

DETAILED DESCRIPTION OF EMBODIMENTS

To enable those skilled in the art to further appreciate the features and effects of the present disclosure, words and terms contained in the specification and appended claims are described and defined. Unless otherwise defined, all technical and scientific terms used herein have the same meaning as commonly understood by those of ordinary skill in the art to which this disclosure pertains. In the case of conflict, the present document and definitions contained herein will control.

As used herein, the term "comprises," "comprising," "includes," "including," "has," "having" or any other variant thereof is construed as an open-ended transitional phrase intended to cover a non-exclusive inclusion. For example, a composition or article of manufacture that comprises a list of elements is not necessarily limited to only those elements but may include other elements not expressly listed or inherent to such composition or article of manufacture. Further, unless expressly stated to the contrary, the term "or" refers to an inclusive or and not to an exclusive or. For example, a condition "A or B" is satisfied by any one of the following: A is true (or present) and B is false (or not present), A is false (or not present) and B is true (or present), and both A and B are true (or present). In addition, whenever open-ended transitional phrases are used, such as "comprises," "comprising," "includes," "including," "has," "having" or any other variant thereof, it is understood that transitional phrases such as "consisting essentially of" and "consisting of" are also disclosed and included.

In this disclosure, features or conditions presented as a numerical range or a percentage range are merely for convenience and brevity. Therefore, a numerical range or a percentage range should be interpreted as encompassing and specifically disclosing all possible subranges and individual numerals or values therein, particularly all integers therein. For example, a range of "1 to 8" or "between 1 and 8" should be understood as explicitly disclosing all subranges such as 1 to 7, 2 to 8, 2 to 6, 3 to 6, 4 to 8, 3 to 8 and so on, particularly all subranges defined by integers, as well as disclosing all individual values such as 1, 2, 3, 4, 5, 6, 7 and 8. Unless otherwise defined, the aforesaid interpretation rule should be applied throughout the present disclosure regardless broadness of the scope.

Whenever amount, concentration or other numeral or parameter is expressed as a range, a preferred range or a series of upper and lower limits, it is understood that all ranges defined by any pair of the upper limit or preferred value and the lower limit or preferred value are specifically disclosed, regardless whether these ranges are explicitly described or not. In addition, unless otherwise defined, whenever a range is mentioned, the range should be interpreted as inclusive of the endpoints and every integers and fractions in the range.

Given the intended purposes and advantages of this disclosure are achieved, numerals or figures have the precision of their significant digits. For example, 40.0 should be understood as covering a range of 39.50 to 40.49.

As used herein, a Markush group or a list of items is used to describe examples or embodiments of the present disclosure. A skilled artisan will appreciate that all subgroups of members or items and individual members or items of the Markush group or list can also be used to describe the present disclosure. For example, when X is described as being "selected from a group consisting of $X_1$, $X_2$ and $X_3$," it is intended to disclose the situations of X is $X_1$ and X is $X_1$ and/or $X_2$ and/or $X_3$. In addition, when a Markush group or a list of items is used to describe examples or embodiments of the present disclosure, a skilled artisan will understand that any subgroup or any combination of the members or items in the Markush group or list may also be used to describe the present disclosure. Therefore, when X is described as being "selected from a group consisting of $X_1$, $X_2$ and $X_3$," and Y is described as being "selected from a group consisting of $Y_1$, $Y_2$ and $Y_3$," the disclosure of any combination of X is $X_1$ and/or $X_2$ and/or $X_3$ and Y is $Y_1$ and/or $Y_2$ and/or $Y_3$.

The following embodiments and examples are illustrative in nature and are not intended to limit the present disclosure and its application. In addition, the present disclosure is not bound by any theory described in the background and summary above or the following embodiments or examples.

As described above, a primary object of the present disclosure is to provide a resin composition, comprising: a first vinyl-containing polyphenylene oxide resin, a prepolymer thereof or both; and a second vinyl-containing polyphenylene oxide resin or a prepolymer thereof; wherein the first vinyl-containing polyphenylene oxide resin has a number average molecular weight of between 500 and 1500, and the second vinyl-containing polyphenylene oxide resin has a number average molecular weight of between 1600 and 3500.

As used herein, "vinyl-containing" refers to the presence of an ethylenic carbon-carbon double bond (C=C) or a functional group derived therefrom in a compound. Therefore, examples of "vinyl-containing" may include, but not limited to, a structure containing a vinyl group, an allyl group, a vinylbenzyl group, a methacrylate or the like. Unless otherwise specified, the position of the aforesaid functional group is not particularly limited and may be located at the terminal of a long chain structure.

As used herein, "polyphenylene oxide" refers to an aromatic polymer having two or more "-(phenylene-oxy)-" structures. The phenylene group may be optionally substituted or unsubstituted. For example, the phenylene group may be substituted at position number 2, at position number 6 or at position number 2 and number 6 by a C1 to C6 alkyl group. As used herein, "natural number" includes 0 and positive integers.

As used herein, "prepolymer" refers to the product of a compound subject to preliminary or partial polymerization and retaining a reactive functional group which may be subject to further polymerization or crosslinking reaction.

Unless otherwise specified, the ratio or content of different components in the resin composition is not particularly limited. For example, the resin composition may comprise: 1 to 100 parts by weight of a first vinyl-containing polyphenylene oxide resin, a prepolymer thereof or both; and 1 to 100 parts by weight of a second vinyl-containing polyphenylene oxide resin or a prepolymer thereof.

In one embodiment, the resin composition may comprise: 5 to 80 parts by weight of a first vinyl-containing polyphenylene oxide resin, a prepolymer thereof or both; and 5 to 80 parts by weight of a second vinyl-containing polyphenylene oxide resin or a prepolymer thereof. In other words, relative to 5 to 80 parts by weight of a first vinyl-containing polyphenylene oxide resin, a prepolymer thereof or both, the resin composition may comprise 5, 10, 20, 30, 40, 50, 60, 70 or 80 parts by weight of a second vinyl-containing polyphenylene oxide resin or a prepolymer thereof, but not limited thereto; and relative to 5 to 80 parts by weight of a second vinyl-containing polyphenylene oxide resin or a prepolymer thereof, the resin composition may comprise 5, 10, 20, 30, 40, 50, 60, 70 or 80 parts by weight of a first vinyl-containing polyphenylene oxide resin, a prepolymer thereof or both, but not limited thereto.

In one embodiment, the resin composition comprises 10 to 50 parts by weight of the first vinyl-containing polyphenylene oxide resin and 10 to 80 parts by weight of the prepolymer of the second vinyl-containing polyphenylene oxide resin.

In one embodiment, the resin composition comprises 10 to 50 parts by weight of the first vinyl-containing polyphenylene oxide resin and 10 to 50 parts by weight of the prepolymer of the second vinyl-containing polyphenylene oxide resin.

In one embodiment, the resin composition comprises 10 to 50 parts by weight of the second vinyl-containing polyphenylene oxide resin and 10 to 80 parts by weight of the prepolymer of the first vinyl-containing polyphenylene oxide resin.

In one embodiment, the resin composition comprises 10 to 30 parts by weight of the second vinyl-containing polyphenylene oxide resin and 30 to 80 parts by weight of the prepolymer of the first vinyl-containing polyphenylene oxide resin.

In one embodiment, the resin composition comprises 10 to 30 parts by weight of the second vinyl-containing polyphenylene oxide resin and 60 to 80 parts by weight of the prepolymer of the first vinyl-containing polyphenylene oxide resin.

Unless otherwise specified, the first vinyl-containing polyphenylene oxide resin and/or the second vinyl-containing polyphenylene oxide resin may be present as a prepolymer. For example, the resin composition described herein may comprise the prepolymer of the first vinyl-containing polyphenylene oxide resin and the second vinyl-containing polyphenylene oxide resin. For example, the resin composition described herein may comprise the first vinyl-containing polyphenylene oxide resin and the prepolymer of the second vinyl-containing polyphenylene oxide resin. For example, the resin composition described herein may comprise the prepolymer of the first vinyl-containing polyphenylene oxide resin and the prepolymer of the second vinyl-containing polyphenylene oxide resin.

The prepolymer may be formed by prepolymerization of the first vinyl-containing polyphenylene oxide resin or the second vinyl-containing polyphenylene oxide resin and any one or more of a cyanate ester resin, a small molecule vinyl compound, a maleimide resin, an acrylate and a polyolefin, as described in detail below.

The cyanate ester resin may include any one or more cyanate ester resins used for preparing a prepreg, a resin film, a resin film with copper foil, a laminate or a printed circuit board, such as a compound having an Ar—O—C≡N structure, wherein Ar may be a substituted or unsubstituted aromatic group. Examples include but are not limited to novolac cyanate ester resin, bisphenol A cyanate ester resin, bisphenol F cyanate ester resin, dicyclopentadiene-containing cyanate ester resin, naphthalene-containing cyanate ester resin, phenolphthalein cyanate ester resin, adamantane cyanate ester resin, fluorene cyanate ester resin or a combination thereof. The novolac cyanate ester resin may be bisphenol A novolac cyanate ester resin, bisphenol F novolac cyanate ester resin or a combination thereof. For example, the cyanate ester resin may be available under the tradename Primaset PT-15, PT-30S, PT-60S, BA-200, BA-230S, BA-3000S, BTP-2500, BTP-6020S, DT-4000, DT-7000, ULL950S, HTL-300, CE-320, LVT-50, or LeCy sold by Lonza.

The small molecule vinyl compound as used herein refers to a vinyl-containing compound with a molecular weight of less than or equal to 1000, preferably between 100 and 900 and more preferably between 100 and 800. According to the present disclosure, the small molecule vinyl compound may include, but not limited to, divinylbenzene (DVB), bis (vinylbenzyl) ether (BVBE), bis(vinylphenyl) ethane (BVPE), triallyl isocyanurate (TAIC), triallyl cyanurate (TAC), 1,2,4-trivinyl cyclohexane (TVCH) or a combination thereof.

The maleimide resin refers to a compound, monomer, mixture, oligomer or polymer containing at least one maleimide group. Unless otherwise specified, the maleimide resin used in the present disclosure is not particularly limited and may include any one or more maleimide resins used for preparing a prepreg, a resin film, a resin film with copper foil, a laminate or a printed circuit board. Examples include but are not limited to 4,4'-diphenylmethane bismaleimide, oligomer of phenylmethane maleimide (a.k.a. polyphenylmethane maleimide), m-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, 1,6-bismaleimide-(2,2,4-trimethyl hexane), N-2,3-xylylmaleimide, N-2,6-xylenemaleimide, N-phenylmaleimide, maleimide resin containing aliphatic long chain structure, prepolymer thereof and a combination thereof. The aforesaid prepolymer may for example be a prepolymer of diallyl compound and maleimide resin, a prepolymer of diamine and maleimide resin, a prepolymer of multi-functional amine and maleimide resin or a prepolymer of acid phenol compound and maleimide resin.

For example, the maleimide resin may include products such as BMI-1000, BMI-1000H, BMI-1100, BMI-1100H, BMI-2000, BMI-2300, BMI-3000, BMI-3000H, BMI-4000H, BMI-5000, BMI-5100, BM-7000 and BMI-7000H available from Daiwakasei Co., Ltd., or products such as BMI-70 and BMI-80 available from K.I Chemical Industry Co., Ltd.

For example, the maleimide resin containing aliphatic long chain structure may include products such as BMI-689, BMI-1400, BMI-1500, BMI-1700, BMI-2500, BMI-3000, BMI-5000 and BMI-6000 sold by Designer Molecules Inc.

The acrylate may include, but not limited to, tricyclodecane di(meth)acrylate, tri(meth)acrylate, 1,1'-[(octahydro-4, 7-methano-1H-indene-5,6-diyl)bis(methylene)]ester (e.g., SR833S, available from Sartomer) or a combination thereof.

Examples of polyolefin include but are not limited to styrene-butadiene-divinylbenzene terpolymer, styrene-butadiene-maleic anhydride terpolymer, vinyl-polybutadiene-urethane oligomer, styrene butadiene copolymer, hydrogenated styrene butadiene copolymer, styrene isoprene copolymer, hydrogenated styrene isoprene copolymer, hydrogenated styrene-butadiene-divinylbenzene copolymer, polybutadiene (homopolymer of butadiene), maleic anhydride-butadiene copolymer, methyl styrene copolymer or a combination thereof.

The first vinyl-containing polyphenylene oxide resin or the second vinyl-containing polyphenylene oxide resin may be prepolymerized with any one or more components described above under proper conditions, such as in the presence of peroxide and solvent, so as to obtain the prepolymer of the first vinyl-containing polyphenylene oxide resin or the prepolymer of the second vinyl-containing polyphenylene oxide resin.

For example, the first vinyl-containing polyphenylene oxide resin or the second vinyl-containing polyphenylene oxide resin may be dissolved and mixed together with any one or more of a cyanate ester resin, a small molecule vinyl compound, a maleimide resin, an acrylate and a polyolefin, followed by the addition of a peroxide if needed, then the temperature is increased to such as 70° C. to 110° C., stirred and reacted for 4 to 10 hours, and the solution thus obtained is purified to obtain the product, which is the prepolymer of the first vinyl-containing polyphenylene oxide resin or the prepolymer of the second vinyl-containing polyphenylene oxide resin.

The solvent may be any solvent suitable for dissolving the vinyl-containing polyphenylene oxide resin, cyanate ester resin, small molecule vinyl compound, maleimide resin, acrylate and/or polyolefin, and may comprise, but not limited to, methanol, ethanol, ethylene glycol monomethyl ether, acetone, butanone (methyl ethyl ketone), methyl isobutyl ketone, cyclohexanone, toluene, xylene, methoxyethyl acetate, ethoxyethyl acetate, propoxyethyl acetate, ethyl acetate, dimethylformamide, dimethylacetamide, propylene glycol methyl ether, or a mixture thereof.

The peroxide may be any peroxide suitable for initiating the prepolymerization of the vinyl-containing polyphenylene oxide resin and the cyanate ester resin, small molecule vinyl compound, maleimide resin, acrylate and/or polyolefin, and may comprise, but not limited to, dicumyl peroxide, tert-butyl peroxybenzoate, dibenzoyl peroxide (BPO), 2,5-dimethyl-2,5-di(tert-butylperoxy)-3-hexyne (25B), bis(tert-butylperoxyisopropyl)benzene or a combination thereof.

For example, a first vinyl-containing polyphenylene oxide resin (or a second vinyl-containing polyphenylene oxide resin), a cyanate ester resin, a peroxide and a toluene solvent may be well mixed, heated to 70° C. to 110° C. and reacted for 4 to 10 hours, and the product is purified to obtain a prepolymer of the first vinyl-containing polyphenylene oxide resin (or of the second vinyl-containing polyphenylene oxide resin).

For example, a first vinyl-containing polyphenylene oxide resin (or a second vinyl-containing polyphenylene oxide resin), a cyanate ester resin, a small molecule vinyl compound, a peroxide and a toluene solvent may be well mixed, heated to 70° C. to 110° C. and reacted for 4 to 10 hours, and the product is purified to obtain a prepolymer of the first vinyl-containing polyphenylene oxide resin (or of the second vinyl-containing polyphenylene oxide resin).

In one embodiment, the first vinyl-containing polyphenylene oxide resin comprises a vinylbenzyl-containing polyphenylene oxide resin, and the second vinyl-containing polyphenylene oxide resin comprises a vinylbenzyl-containing polyphenylene oxide resin, a methacrylate-containing polyphenylene oxide resin, an allyl-containing polyphenylene oxide resin, a vinylbenzyl-modified bisphenol A polyphenylene oxide resin, a chain-extended vinyl-containing polyphenylene oxide resin or a combination thereof.

For example, the first vinyl-containing polyphenylene oxide resin may be a vinylbenzyl-containing polyphenylene oxide resin with a number average molecular weight of about 1200 (such as OPE-2st 1200, available from Mitsubishi Gas Chemical Co., Inc.).

For example, the second vinyl-containing polyphenylene oxide resin may be a vinylbenzyl-containing polyphenylene oxide resin with a number average molecular weight of about 2200 (such as OPE-2st 2200, available from Mitsubishi Gas Chemical Co., Inc.), a methacrylate-containing polyphenylene oxide resin with a number average molecular weight of about 1900 to 2300 (such as SA-9000, available from Sabic), a vinylbenzyl-modified bisphenol A polyphenylene oxide resin with a number average molecular weight of about 2400 to 2800, a chain-extended vinyl-containing polyphenylene oxide resin with a number average molecular weight of between about 2200 and about 3000, or a combination thereof. The chain-extended vinyl-containing polyphenylene oxide resin may include various polyphenylene oxide resins disclosed in the US Patent Application Publication No. 2016/0185904 A1, all of which are incorporated herein by reference in their entirety.

According to the present disclosure, the first vinyl-containing polyphenylene oxide resin has a number average molecular weight of between 500 and 1500, such as between 800 and 1400.

In one embodiment, the first vinyl-containing polyphenylene oxide resin may comprise a structure of Formula (1-1):

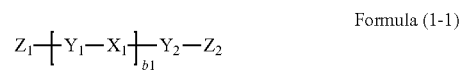

Formula (1-1)

wherein b1 is a natural number of 0 to 2;

$X_1$ comprises a structure of any one of Formula (2) to Formula (4):

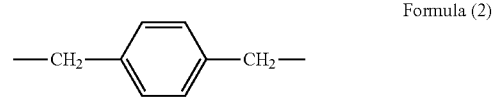

Formula (2)

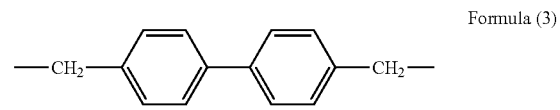

Formula (3)

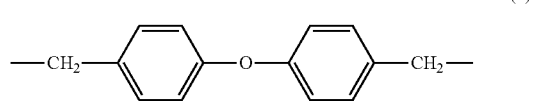

Formula (4)

$Y_1$ and $Y_2$ individually comprise a structure of Formula (5-1):

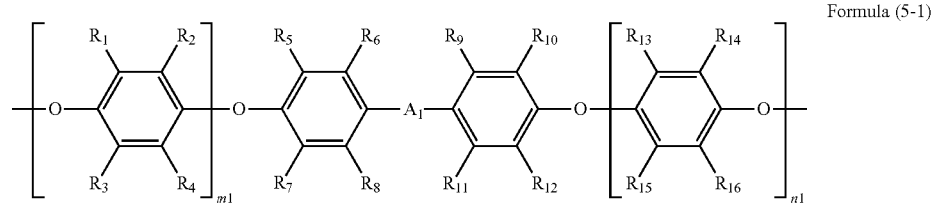

Formula (5-1)

wherein m1 and n1 independently represent an integer of 1 to 15, such as 1, 5, 10 or 15; $R_1$ to $R_{16}$ are independently selected from H, —$CH_3$ and a halogen atom (e.g., chlorine, bromine, or iodine); $A_1$ is selected from a covalent bond, —$CH_2$—, —$CH(CH_3)$—, —$C(CH_3)_2$—, —O—, —S—, —$SO_2$— and a carbonyl group;

$Z_1$ and $Z_2$ individually comprise a structure of Formula (6-1):

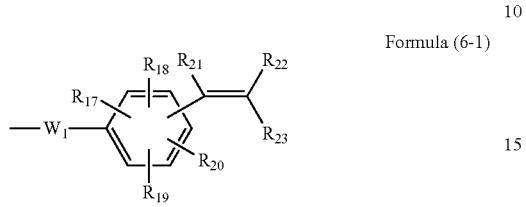

Formula (6-1)

wherein $R_{17}$ to $R_{23}$ are individually selected from H, —$CH_3$ or a halogen atom, and $W_1$ is a C1 to C3 bivalent aliphatic group, such as methylene, ethylene, or propylene.

For example, the first vinyl-containing polyphenylene oxide resin may comprise a structure below:

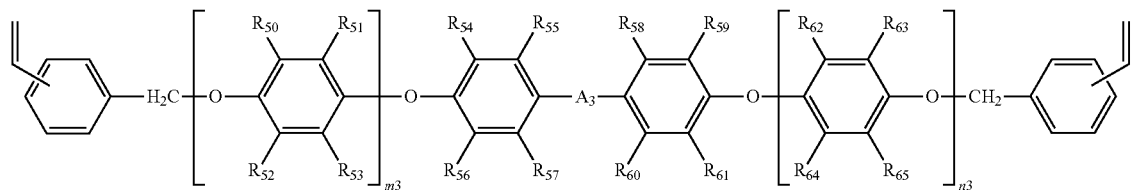

wherein m3 and n3 independently represent an integer of 1 to 15; $R_{50}$ to $R_{65}$ are independently selected from H, —$CH_3$ and a halogen atom; and $A_3$ is selected from a covalent bond, —$CH_2$—, —$CH(CH_3)$—, —$C(CH_3)_2$—, —O—, —S—, —$SO_2$— and a carbonyl group;

According to the present disclosure, the second vinyl-containing polyphenylene oxide resin has a number average molecular weight of between 1600 and 3500, such as between 1800 and 3000. In addition, in one embodiment, the second vinyl-containing polyphenylene oxide resin may comprise a structure of Formula (1-2):

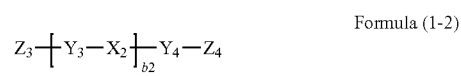

Formula (1-2)

wherein b2 is a natural number of 0 to 8;

$X_2$ comprises a structure of Formula (2) to Formula (4) or a combination thereof:

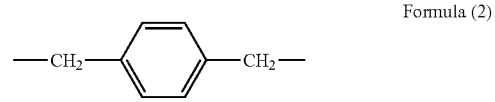

Formula (2)

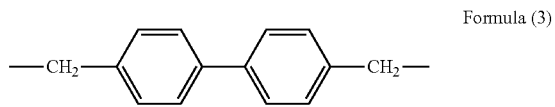

Formula (3)

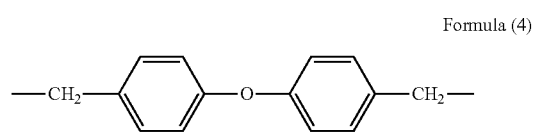 [SMILES: CCc1ccc(Oc2ccc(CC)cc2)cc1]

Formula (4)

$Y_3$ and $Y_4$ individually comprise a structure of Formula (5-2):

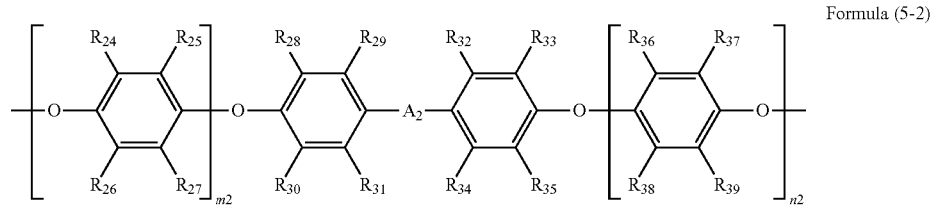

Formula (5-2)

wherein m2 and n2 independently represent an integer of 1 to 30, such as 1, 5, 10, 15, 20, 25 or 30; $R_{24}$ to $R_{39}$ are independently selected from H, —$CH_3$ and a halogen atom (e.g., chlorine, bromine, or iodine); $A_2$ is selected from a covalent bond, —$CH_2$—, —$CH(CH_3)$—, —$C(CH_3)_2$—, —O—, —S—, —$SO_2$— and a carbonyl group;

$Z_3$ and $Z_4$ individually comprise a structure of Formula (6-2), Formula (6-3) or Formula (6-4):

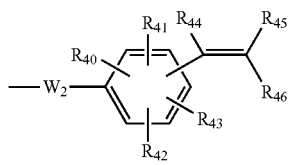

Formula (6-2)

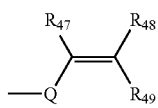

Formula (6-3)

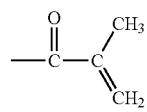

Formula (6-4)

wherein $R_{40}$ to $R_{49}$ are individually selected from H, —$CH_3$ or a halogen atom, and $W_2$ and Q are individually a $C_1$ to $C_3$ bivalent aliphatic group (e.g., methylene, ethylene, or propylene).

In one embodiment, in addition to the first vinyl-containing polyphenylene oxide resin (and/or a prepolymer thereof) and the second vinyl-containing polyphenylene oxide resin (or a prepolymer thereof), the resin composition disclosed herein may further comprise the following component as a crosslinking agent: an epoxy resin, another polyphenylene oxide resin, a cyanate ester resin, a small molecule vinyl compound, a maleimide resin, an acrylate, a phenolic resin, a benzoxazine resin, a styrene maleic anhydride, a polyolefin, a polyester resin, an amine curing agent, a polyamide resin, a polyimide resin or a combination thereof. Examples of the cyanate ester resin, small molecule vinyl compound, maleimide resin, acrylate and polyolefin are as described above.

Amount of the aforesaid crosslinking agent is not particularly limited; for example, relative to a total of 60 parts by weight of the first vinyl-containing polyphenylene oxide resin (and/or a prepolymer thereof) and the second vinyl-containing polyphenylene oxide resin (or a prepolymer thereof), one or more of the crosslinking agents above may be used at an amount of 1 to 200 parts by weight, preferably 5 to 150 parts by weight, more preferably 10 to 100 parts by weight and even more preferably 10 to 50 parts by weight. The total amount of the crosslinking agent(s) may be 1 to 200 parts by weight, preferably 5 to 150 parts by weight, more preferably 10 to 100 parts by weight, and even more preferably 20 to 80 parts by weight.

For example, the epoxy resin may be any epoxy resins known in the field to which this disclosure pertains, including but not limited to bisphenol A epoxy resin, bisphenol F epoxy resin, bisphenol S epoxy resin, bisphenol AD epoxy resin, novolac epoxy resin, trifunctional epoxy resin, tetrafunctional epoxy resin, multifunctional novolac epoxy resin, dicyclopentadiene (DCPD) epoxy resin, phosphorus-containing epoxy resin, p-xylene epoxy resin, naphthalene epoxy resin (e.g., naphthol epoxy resin), benzofuran epoxy resin, isocyanate-modified epoxy resin, or a combination thereof. The novolac epoxy resin may be phenol novolac epoxy resin, bisphenol A novolac epoxy resin, bisphenol F novolac epoxy resin, biphenyl novolac epoxy resin, phenol benzaldehyde epoxy resin, phenol aralkyl novolac epoxy resin or o-cresol novolac epoxy resin, wherein the phosphorus-containing epoxy resin may be DOPO (9,10-dihydro-9-oxa-10-phosphaphenanthrene-10-oxide) epoxy resin, DOPO-HQ epoxy resin or a combination thereof. The DOPO epoxy resin may be any one or more selected from DOPO-containing phenolic novolac epoxy resin, DOPO-containing cresol novolac epoxy resin and DOPO-containing bisphenol-A novolac epoxy resin; the DOPO-HQ epoxy resin may be any one or more selected from DOPO-HQ-containing phenolic novolac epoxy resin, DOPO-HQ-containing cresol novolac epoxy resin and DOPO-HQ-containing bisphenol-A novolac epoxy resin.

For example, as a crosslinking agent, the aforesaid another polyphenylene oxide resin may comprise, other than the first vinyl-containing polyphenylene oxide resin and the second vinyl-containing polyphenylene oxide resin, another polyphenylene oxide resin, such as a maleimide-terminated polyphenylene oxide resin, an anhydride-terminated polyphenylene oxide resin, a cyanate-terminated polyphenylene oxide resin or a hydroxyl-terminated polyphenylene oxide resin. For example, unless otherwise specified, the polyphenylene oxide resin used in the present disclosure is not particularly limited and may be any commercial product, product synthesized by Applicant or a combination thereof.

For example, the phenolic resin may comprise but not limited to mono-functional, bifunctional or multifunctional phenolic resin, comprising phenolic resin of a resin composition conventionally used for making prepregs, such as phenoxy resin, phenol novolac resin, etc.

For example, the benzoxazine resin includes, but not limited to, bisphenol A benzoxazine resin, bisphenol F benzoxazine resin, phenolphthalein benzoxazine resin, dicyclopentadiene benzoxazine resin, phosphorus-containing benzoxazine resin, oxydianiline benzoxazine resin, or unsaturated bond-containing benzoxazine resin, such as but not limited to LZ-8270, LZ-8280, LZ-8290 or LZ-8298 available from Huntsman, HFB-2006M available from Showa High Polymer, or KZH-5031 available from Kolon Industries Inc.

For example, in the styrene maleic anhydride, the ratio of styrene (S) and maleic anhydride (MA) may be for example 1/1, 2/1, 3/1, 4/1, 6/1, 8/1 or 12/1, including styrene maleic anhydride copolymers such as SMA-1000, SMA-2000, SMA-3000, EF-30, EF-40, EF-60 and EF-80 available from Cray Valley.

For example, the polyester resin may be prepared by esterification of dicarboxylic aromatic compounds with dihydroxyl aromatic compounds. Examples include, but not limited to, HPC-8000, HPC-8150 or HPC-8200 available from D.I.C. Corporation.

For example, the amine curing agent may include, but not limited to, any one or a combination of diamino diphenyl sulfone, diamino diphenyl methane, diamino diphenyl ether, diamino diphenyl sulfide and dicyandiamide (DICY).

For example, the polyamide resin may be any polyamide resin known in the field to which this disclosure pertains, including but not limited to various commercially available polyamide resin products.

For example, the polyimide resin may be any polyimide resin known in the field to which this disclosure pertains, including but not limited to various commercially available polyimide resin products.

In addition, the resin composition may optionally further comprise: flame retardant, inorganic filler, curing accelerator, solvent, silane coupling agent, coloring agent, toughening agent or a combination thereof.

The flame retardant used herein may be any one or more flame retardants used for preparing a prepreg, a resin film, a resin film with copper foil, a laminate or a printed circuit board; examples of the flame retardant include but are not limited to phosphorus-containing flame retardant, preferably any one, two or more selected from the following group: ammonium polyphosphate, hydroquinone bis-(diphenyl phosphate), bisphenol A bis-(diphenylphosphate), tri(2-carboxyethyl) phosphine (TCEP), phosphoric acid tris(chloroisopropyl) ester, trimethyl phosphate (TMP), dimethyl methyl phosphonate (DMMP), resorcinol bis(dixylenyl phosphate) (RDXP, such as commercially available PX-200, PX-201, and PX-202), phosphazene (such as commercially available SPB-100, SPH-100, and SPV-100), melamine polyphosphate, DOPO and its derivatives or resins, DPPO (diphenylphosphine oxide) and its derivatives or resins, melamine cyanurate, tri-hydroxy ethyl isocyanurate and aluminium phosphinate (e.g., commercially available OP-930 and OP-935).

For example, the flame retardant may be a DPPO compound (e.g., di-DPPO compound), a DOPO compound (e.g., di-DOPO compound), a DOPO resin (e.g., DOPO-HQ, DOPO-NQ, DOPO-PN, and DOPO-BPN) and a DOPO-containing epoxy resin, wherein DOPO-PN is a DOPO phenol novolac compound, and DOPO-BPN may be a bisphenol novolac compound, such as DOPO-BPAN (DOPO-bisphenol A novolac), DOPO-BPFN (DOPO-bisphenol F novolac) and DOPO-BPSN (DOPO-bisphenol S novolac).

For example, the inorganic filler may be any one or more inorganic fillers used for preparing a prepreg, a resin film, a resin film with copper foil, a laminate or a printed circuit board; examples of inorganic filler include but are not limited to silica (fused, non-fused, porous or hollow type), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, mica, boehmite (AlOOH), calcined talc, talc, silicon nitride and calcined kaolin. Moreover, the inorganic filler can be spherical, fibrous, plate-like, particulate, sheet-like or whisker-like in shape and can be optionally pretreated by a silane coupling agent.

For example, the curing accelerator (including curing initiator) may comprise a catalyst, such as a Lewis base or a Lewis acid. The Lewis base may comprise any one or more of imidazole, boron trifluoride-amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP) and 4-dimethylaminopyridine (DMAP). The Lewis acid may comprise metal salt compounds, such as those of manganese, iron, cobalt, nickel, copper and zinc, such as zinc octanoate or cobalt octanoate. The curing accelerator also includes a curing initiator, such as a peroxide capable of producing free radicals, examples of curing initiator including but not limited to dicumyl peroxide, tert-butyl peroxybenzoate, dibenzoyl peroxide (BPO), 2,5-dimethyl-2,5-di(tert-butylperoxy)-3-hexyne (25B), bis(tert-butylperoxyisopropyl)benzene or a combination thereof.

For example, the solvent may comprise, but not limited to, methanol, ethanol, ethylene glycol monomethyl ether, acetone, butanone (methyl ethyl ketone), methyl isobutyl ketone, cyclohexanone, toluene, xylene, methoxyethyl acetate, ethoxyethyl acetate, propoxyethyl acetate, ethyl acetate, dimethylformamide, dimethylacetamide, propylene glycol methyl ether, or a mixture thereof.

For example, the silane coupling agent may comprise silane (such as but not limited to siloxane) and may be further categorized according to the functional groups into amino silane, epoxide silane, vinyl silane, acrylate silane, methacrylate silane, hydroxyl silane, isocyanate silane, methacryloxy silane and acryloxy silane.

For example, the coloring agent may comprise but not limited to dye or pigment.

The purpose of adding toughening agent is to improve the toughness of the resin composition. The toughening agent may comprise, but not limited to, rubber resin, carboxyl-terminated butadiene acrylonitrile rubber (CTBN rubber), core-shell rubber, or a combination thereof.

The resin compositions of various embodiments may be used for making different articles, including but not limited to a prepreg, a resin film, a resin film with copper foil, a laminate or a printed circuit board.

For example, the resin composition according to each of the various embodiments may be coated on a polyester (PET) film or a polyimide (PI) film, followed by baking and heating to the semi-cured state (B-Stage) to obtain a resin film.

For example, the resin composition according to each of the various embodiments may be coated on a copper foil, followed by baking and heating to the semi-cured state to obtain the resin film with copper foil, such as a resin coated copper (RCC).

For example, the resin composition according to each of the various embodiments may be used to make a prepreg, which has a reinforcement material and a layered structure (e.g., insulation layer) formed thereon, wherein the layered structure is made by heating the resin composition to a semi-cured state (B-Stage) at a temperature for example between 120° C. and 160° C. For example, the reinforcement material may be any one of a fiber material, woven fabric, and non-woven fabric, and the woven fabric preferably comprises fiberglass fabrics. Types of fiberglass fabrics are not particularly limited and may be any commercial fiberglass fabric used for various printed circuit boards, such as E-glass fabric, D-glass fabric, S-glass fabric, T-glass fabric, L-glass fabric or Q-glass fabric, wherein the fiber may comprise yarns and rovings, in spread form or standard form. Non-woven fabric preferably comprises liquid crystal polymer non-woven fabric, such as polyester non-woven fabric, polyurethane non-woven fabric and so on, but not limited thereto. Woven fabric may also comprise liquid crystal polymer woven fabric, such as polyester woven fabric, polyurethane woven fabric and so on, but not limited thereto. The reinforcement material may increase the mechanical strength of the prepreg. In one preferred embodiment, the reinforcement material can be optionally pre-treated by a silane coupling agent. The prepreg may be further heated and cured to the C-stage to form an insulation layer.

For example, resin compositions of various embodiments of the present disclosure may be made into a laminate, such as a copper-clad laminate, which comprises two copper foils and an insulation layer disposed between the copper foils, wherein the insulation layer is made by curing the resin compositions at high temperature and high pressure, a suitable curing temperature being for example between 190° C. and 220° C. and preferably between 200° C. and 215° C. and a suitable curing time being 90 to 180 minutes and preferably 110 to 150 minutes. The insulation layer may be obtained by curing the aforesaid prepreg, resin film with copper foil or resin film. In one preferred embodiment, the laminate is a copper-clad laminate.

In one embodiment, the laminate may be further processed by trace formation processes to provide a printed circuit board.

The resin composition according to the present disclosure has one or more preferred properties including lower coefficient of thermal expansion, better dimensional stability, better interlayer bonding strength, better T288 thermal resistance, etc.

For example, the resin composition according to the present disclosure may achieve one, more or all of the following properties:
- a coefficient of thermal expansion of less than 35.0 ppm/° C. as measured with a thermomechanical analyzer by reference to IPC-TM-650 2.4.24.5, such as between 25.0 ppm/° C. and 35.0 ppm/° C., between 26.0 ppm/° C. and 34.0 ppm/° C. or between 26.0 ppm/° C. and 32.0 ppm/° C.;
- a T288 thermal resistance as measured by reference to IPC-TM-650 2.4.24.1 of greater than or equal to 70 minutes, such as greater than or equal to 90 minutes, 120 minutes, 150 minutes, 180 minutes, or 240 minutes;
- an interlayer bonding strength as measured by reference to IPC-TM-650 2.4.8 of greater than or equal to 2.85 lb/in, such as between 2.85 lb/in and 3.20 lb/in; and
- a Z-axis dimensional change ratio as measured by reference to IPC-TM-650 2.4.24.5 of less than or equal to 1.80%, such as between 1.30% and 1.80%.

Specifically, the resin compositions according to the present disclosure and articles made therefrom may achieve one, more or all of the following features:
- by using a first vinyl-containing polyphenylene oxide resin with a number average molecular weight of 500-1500 in conjunction with a second vinyl-containing polyphenylene oxide resin with a number average molecular weight of 1600-3500, in contrast to the use of a single polyphenylene oxide resin with a number average molecular weight of 500-1500 (e.g., a vinylbenzyl-containing polyphenylene oxide resin), laminates made from the resin composition according to the present disclosure have better (lower) coefficient of thermal expansion, higher interlayer bonding strength and better T288 thermal resistance;
- by using a first vinyl-containing polyphenylene oxide resin with a number average molecular weight of 500-1500 in conjunction with a second vinyl-containing polyphenylene oxide resin with a number average molecular weight of 1600-3500, in contrast to the use of a single polyphenylene oxide resin with a number average molecular weight of 1600-3500 (e.g., a vinylbenzyl-containing polyphenylene oxide resin or a methyl methacrylate-containing polyphenylene oxide resin), laminates made from the resin composition according to the present disclosure have better (lower) coefficient of thermal expansion, better (lower) dimensional change ratio and better T288 thermal resistance; and
- the combination of a first vinyl-containing polyphenylene oxide resin with a number average molecular weight of 500-1500 and a second vinyl-containing polyphenylene oxide resin with a number average molecular weight of 1600-3500 according to the present disclosure unexpectedly achieves better (lower) coefficient of thermal expansion, better (lower) dimensional change ratio, higher interlayer bonding strength, and better T288 thermal resistance.

Materials and reagents used in Preparation Examples, Examples and Comparative Examples disclosed herein are listed below:
- OPE-2st 1200: vinylbenzyl-terminated polyphenylene oxide resin with a number average molecular weight (Mn) of about 1200 (used as a first vinyl-containing polyphenylene oxide resin), available from Mitsubishi Gas Chemical Co., Inc.;
- OPE-2st 2200: vinylbenzyl-terminated polyphenylene oxide resin with a number average molecular weight (Mn) of about 2200 (used as a second vinyl-containing polyphenylene oxide resin), available from Mitsubishi Gas Chemical Co., Inc.;
- SA-9000: methacrylate-terminated polyphenylene oxide resin with a number average molecular weight (Mn) of about 1900-2300 (used as a second vinyl-containing polyphenylene oxide resin), available from SABIC;
- TAIC: triallyl isocyanurate, available from Sigma Aldrich;
- BA-230S: bisphenol A type cyanate ester resin (BPA-CE), available from LONZA;
- BPO: benzoyl peroxide, available from NOF Corporation;
- BMI-5100: 3,3'-dimethyl-5,5'-diethyl-4,4'-diphenylmethane bismaleimide, available from Daiwakasei Industry Co., Ltd.;
- 25B: 2,5-dimethyl-2,5-di(t-butylperoxy)-3-hexyne, available from NOF Corporation;
- SC-2500-SMJ: spherical silica pre-treated by methacrylate silane coupling agent, available from Admatechs;
- Toluene: available from Chambeco Group.
- MEK: methyl ethyl ketone, source not limited.

Prepolymer Preparation Example 1

30 parts by weight of OPE-2st 1200, 20 parts by weight of BA-230S, 10 parts by weight of TAIC and 0.3 part by weight of BPO were added to 40 parts by weight of methyl ethyl ketone solvent, stirred in a stirred tank until the powders were fully dissolved and then gradually heated to a temperature of 85° C., and stirred for another 4 hours so as to obtain a solution which was subject to purification to obtain a prepolymer P1 of the first vinyl-containing polyphenylene oxide resin.

Prepolymer Preparation Example 2

50 parts by weight of OPE-2st 1200, 20 parts by weight of BA-230S, 10 parts by weight of TAIC and 0.3 part by weight of BPO were added to 40 parts by weight of methyl ethyl ketone solvent, stirred in a stirred tank until the powders were fully dissolved and then gradually heated to a temperature of 85° C., and stirred for another 4 hours so as to obtain a solution which was subject to purification to obtain a prepolymer P2 of the first vinyl-containing polyphenylene oxide resin.

Prepolymer Preparation Example 3

30 parts by weight of OPE-2st 2200, 20 parts by weight of BA-230S, 10 parts by weight of TAIC and 0.3 part by weight of BPO were added to 40 parts by weight of methyl ethyl ketone solvent, stirred in a stirred tank until the powders were fully dissolved and then gradually heated to a temperature of 85° C., and stirred for another 4 hours so as to obtain a solution which was subject to purification to obtain a prepolymer P3 of the second vinyl-containing polyphenylene oxide resin.

Samples (specimens) were prepared as described below and tested and analyzed under specified conditions below.
1. Prepreg: Resin composition from each Example and each Comparative Example (in part by weight) was separately well-mixed to form a varnish, which was then loaded to an impregnation tank; a fiberglass fabric (e.g., 2116 E-glass fiber fabric, available from Asahi) was impregnated into the impregnation tank to adhere the resin composition onto the fiberglass fabric, followed by heating and baking at 130° C. for about 4 minutes to obtain a prepreg.
2. Copper-containing laminate (e.g., copper-clad laminate, 5-ply, formed by lamination of five prepregs): Two 18 μm RTF (reverse-treated foils) copper foils and five prepregs obtained from 2116 E-glass fiber fabrics impregnated with each Example or Comparative Example and having a resin content of about 55% were prepared and stacked in the order of one copper foil, five prepregs and one copper foil, followed by lamination under vacuum at 30 kgf/cm$^2$ pressure and 200° C. for 120 minutes to form a copper-containing laminate. Insulation layers were formed by laminating five sheets of prepreg between the two copper foils, and the resin content of the insulation layers is about 55%.
3. Copper-free laminate (5-ply, formed by lamination of five prepregs): Each aforesaid copper-containing laminate (5-ply) was etched to remove the two copper foils to obtain a copper-free laminate (5-ply) formed by laminating five sheets of prepreg and having a resin content of about 55%.

Test items and test methods are described below.

Coefficient of Thermal Expansion (CTE)

The copper-free laminate (obtained by laminating five prepregs) specimen was subject to coefficient of thermal expansion (Z-axis) measurement. A thermomechanical analyzer (TMA) was used for measurement (unit: ppm/° C.) by reference to IPC-TM-650 2.4.24.5 at a temperature range from 50° C. to 110° C. at an increase rate of 10° C./minute. Lower coefficient of thermal expansion represents lower expansion of the specimen under heat, indicating the resin composition may have a better property when being used for a printed circuit board. Lower coefficient of thermal expansion is more preferred; in general, a difference of 0.1 ppm/° C. in the coefficient of thermal expansion represents a significant difference.

Dimensional Change Ratio (or Thermal Expansion Ratio)

The copper-free laminate (obtained by laminating five prepregs) specimen was subject to thermomechanical analysis (TMA) during dimensional change ratio measurement. Each specimen was heated from 50° C. to 260° C. at an increase rate of 10° C./minute and then subject to the measurement of dimensional change ratio (%) in Z-axis by reference IPC-TM-650 2.4.24.5, wherein lower dimensional change ratio (%) is more preferred, and in general a difference of greater than or equal to 0.1% represents significant difference.

Interlayer Bonding Strength

The copper-containing laminate (obtained by laminating five prepregs) was cut into a rectangle with a width of 12.7 mm and a length of greater than 60 mm and tested by using a tensile strength tester by reference to IPC-TM-650 2.4.8 with the proviso that the surface copper foil was not etched off and the measurement position was set at the interface between the second prepreg layer and the third prepreg layer; under room temperature (about 25° C.), the cured insulation laminate was tested to measure the force (lb/in) required to separate the two layers. In general, a difference in interlayer bonding strength of greater than 0.1 lb/in represents a significant difference.

T288 Thermal Resistance

The copper-containing laminate (obtained by laminating five prepregs) specimen was used in the T288 thermal resistance test. At a constant temperature of 288° C., a thermomechanical analyzer (TMA) was used by reference to IPC-TM-650 2.4.24.1 "Time to Delamination (TMA Method)" to measure each specimen and record the time to delamination.

Compositions and test results of Examples and Comparative Examples are listed in Table 1 to Table 3.

TABLE 1

Resin compositions of Examples (in part by weight) and test results

| component | name | E1 | E2 | E3 | E4 | E5 | E6 | E7 |
|---|---|---|---|---|---|---|---|---|
| first vinyl-containing PPO | OPE-2st 1200 | 30 | 20 | 50 | 10 | | | 55 |
| second vinyl-containing PPO | OPE-2st 2200 | 30 | 20 | 10 | 50 | 30 | 10 | 5 |
| prepolymer | P1 | | | | | 60 | | |
| | P2 | | | | | | 80 | |
| | P3 | | | | | | | |
| methacrylate-containing PPO | SA-9000 | | 20 | | | | | |
| TAIC | TAIC | 10 | 10 | 10 | 10 | | | 10 |
| BPA-CE | BA-230S | 20 | 20 | 20 | 20 | | | 20 |
| BMI | BMI-5100 | 20 | 20 | 20 | 20 | 20 | 20 | 20 |
| peroxide | 25B | 1 | 1 | 1 | 1 | 1 | 1 | 1 |
| fused silica | SC-2500-SMJ | 110 | 110 | 110 | 110 | 110 | 110 | 110 |
| solvent | toluene | 30 | 30 | 30 | 30 | 30 | 30 | 30 |
| | MEK | 50 | 50 | 50 | 50 | 50 | 50 | 50 |
| property | unit | E1 | E2 | E3 | E4 | E5 | E6 | E7 |
| CTE (Z-axis) | ppm/° C. | 28.5 | 29.3 | 30.1 | 31.5 | 24.7 | 25.3 | 31.2 |
| dimensional change ratio (Z-axis) | % | 1.48 | 1.51 | 1.64 | 1.78 | 1.31 | 1.35 | 1.68 |
| interlayer bonding strength | lb/in | 3.05 | 2.97 | 2.99 | 3.03 | 3.14 | 3.10 | 2.89 |
| T288 thermal resistance | minute | >70 | >70 | >70 | >70 | >70 | >70 | 68 |

TABLE 2

Resin compositions of Examples (in part by weight) and test results

| component | name | E8 | E9 | E10 | E11 | E12 | E13 |
|---|---|---|---|---|---|---|---|
| first vinyl-containing PPO | OPE-2st 1200 | 5 | 30 | 30 | 35 | 30 | 15 |
| second vinyl-containing PPO | OPE-2st 2200 | 55 | | 30 | 15 | 30 | |
| prepolymer | P1 | | | | | | 30 |
| | P2 | | | | | | |
| | P3 | | | | | 60 | |
| methacrylate-containing PPO | SA-9000 | | 30 | | 10 | | 5 |
| TAIC | TAIC | 10 | 10 | 10 | 10 | | 5 |
| BPA-CE | BA-230S | 20 | 20 | | 20 | | 10 |
| BMI | BMI-5100 | 20 | 20 | 20 | 20 | 20 | 20 |
| peroxide | 25B | 1 | 1 | 1 | 1 | 1 | 1 |
| fused silica | SC-2500-SMJ | 110 | 110 | 110 | 110 | 110 | 110 |
| solvent | toluene | 30 | 30 | 30 | 30 | 30 | 30 |
| | MEK | 50 | 50 | 50 | 50 | 50 | 50 |
| property | unit | E8 | E9 | E10 | E11 | E12 | E13 |
| CTE (Z-axis) | ppm/° C. | 33.4 | 29.2 | 29.8 | 28.8 | 31.2 | 25.7 |
| dimensional change ratio (Z-axis) | % | 1.80 | 1.59 | 1.54 | 1.41 | 1.68 | 1.40 |
| interlayer bonding strength | lb/in | 2.95 | 3.07 | 2.98 | 3.07 | 2.99 | 3.07 |
| T288 thermal resistance | minute | 63 | >70 | >70 | >70 | >70 | >70 |

TABLE 3

Resin compositions of Examples (in part by weight) and test results

| component | name | C1 | C2 | C3 | C4 | C5 | C6 | C7 |
|---|---|---|---|---|---|---|---|---|
| first vinyl-containing PPO | OPE-2st 1200 | 60 | | | | | | |
| second vinyl-containing PPO | OPE-2st 2200 | | 60 | | | 30 | 30 | 50 |
| prepolymer | P1 | | | | | | | |
| | P2 | | | | | | | |
| | P3 | | | | | | | |
| methacrylate-containing PPO | SA-9000 | | | 60 | | 30 | 30 | 10 |
| TAIC | TAIC | 10 | 10 | 10 | 10 | 10 | 10 | 10 |
| BPA-CE | BA-230S | 20 | 20 | 20 | 20 | 20 | | 20 |
| BMI | BMI-5100 | 20 | 20 | 20 | 20 | 20 | 20 | 20 |
| peroxide | 25B | 1 | 1 | 1 | 1 | 1 | 1 | 1 |
| fused silica | SC-2500-SMJ | 110 | 110 | 110 | 110 | 110 | 110 | 110 |
| solvent | toluene | 30 | 30 | 30 | 30 | 30 | 30 | 30 |
| | MEK | 50 | 50 | 50 | 50 | 50 | 50 | 50 |
| property | unit | C1 | C2 | C3 | C4 | C5 | C6 | C7 |
| CTE (Z-axis) | ppm/° C. | 35.7 | 40.0 | 41.1 | 37.8 | 39.2 | 40.3 | 38.8 |
| dimensional change ratio (Z-axis) | % | 1.77 | 1.95 | 2.11 | 1.55 | 2.01 | 2.04 | 1.99 |
| interlayer bonding strength | lb/in | 2.77 | 2.91 | 2.81 | 2.55 | 2.86 | 2.75 | 2.88 |
| T288 thermal resistance | minute | 66 | 62 | 63 | >70 | 65 | 64 | 62 |

The following observations can be made according to the test results above.

Comparison of Examples E1 to E4 and E7 to E11 with Comparative Examples C1 to C4 indicates that the combination of a first vinyl-containing polyphenylene oxide resin and a second vinyl-containing polyphenylene oxide resin in the resin composition, relative to the use of only one or absence of vinyl-containing polyphenylene oxide resin in the resin composition, achieves lower coefficient of thermal expansion, lower dimensional change ratio, and higher interlayer bonding strength.

Comparison of Examples E1 to E4 and E7 to E11 with Comparative Examples C5 to C7, which contain two different vinyl-containing polyphenylene oxide resins, indicates that the combination of a first vinyl-containing polyphenylene oxide resin and a second vinyl-containing polyphenylene oxide resin according to the present disclosure in the resin composition, relative to the use of two different second vinyl-containing polyphenylene oxide resins in the resin composition, achieves lower coefficient of thermal expansion, lower dimensional change ratio, higher interlayer bonding strength and better T288 thermal resistance.

On the other hand, comparison of Examples E1 to E4 with E7 and E8 indicates that the use of 10 to 50 parts by weight of the first vinyl-containing polyphenylene oxide resin and 10 to 50 parts by weight of the second vinyl-containing polyphenylene oxide resin in the resin composition, relative to other greater or less use amount, may achieve higher interlayer bonding strength and better T288 thermal resistance.

Moreover, by contrast between Examples E5 and E1 and between Examples E6 and E3, it can be observed that the use of a prepolymer of the first vinyl-containing polyphenylene oxide resin, relative to a non-prepolymerized first vinyl-containing polyphenylene oxide resin, achieves lower coefficient of thermal expansion, lower dimensional change ratio, and higher interlayer bonding strength.

The above detailed description is merely illustrative in nature and is not intended to limit the embodiments of the subject matter or the application and uses of such embodiments. As used herein, the term "exemplary" means "serving as an example, instance, or illustration." Any implementation described herein as exemplary is not necessarily to be construed as preferred or advantageous over other implementations.

Moreover, while at least one exemplary example or comparative example has been presented in the foregoing detailed description, it should be appreciated that a vast number of variations exist. It should also be appreciated that the exemplary one or more embodiments described herein are not intended to limit the scope, applicability, or configuration of the claimed subject matter in any way. Rather, the foregoing detailed description will provide those skilled in the art with a convenient guide for implementing the described one or more embodiments. Also, various changes can be made in the function and arrangement of elements without departing from the scope defined by the claims, which include known equivalents and foreseeable equivalents at the time of filing this patent application.

What is claimed is:

1. A resin composition, comprising:
   a first vinyl-containing polyphenylene oxide resin, a prepolymer thereof or both; and
   a second vinyl-containing polyphenylene oxide resin or a prepolymer thereof; wherein the first vinyl-containing polyphenylene oxide resin has a number average molecular weight of between 500 and 1500, and the second vinyl-containing polyphenylene oxide resin has a number average molecular weight of between 1600 and 3500.

2. The resin composition of claim 1, comprising:
   5 to 80 parts by weight of the first vinyl-containing polyphenylene oxide resin, the prepolymer thereof or both; and
   5 to 80 parts by weight of the second vinyl-containing polyphenylene oxide resin or the prepolymer thereof.

3. The resin composition of claim 1, comprising:
   10 to 50 parts by weight of the first vinyl-containing polyphenylene oxide resin and 10 to 80 parts by weight of the prepolymer of the second vinyl-containing polyphenylene oxide resin; or
   10 to 50 parts by weight of the second vinyl-containing polyphenylene oxide resin and 10 to 80 parts by weight of the prepolymer of the first vinyl-containing polyphenylene oxide resin.

4. The resin composition of claim 1, wherein at least one of the first vinyl-containing polyphenylene oxide resin and the second vinyl-containing polyphenylene oxide resin is present as a prepolymer.

5. The resin composition of claim 4, wherein the prepolymer present is formed by prepolymerization of the first vinyl-containing polyphenylene oxide resin or the second vinyl-containing polyphenylene oxide resin and any one or more of a cyanate ester resin, a small molecule vinyl compound, a maleimide resin, an acrylate and a polyolefin.

6. The resin composition of claim 1, wherein the first vinyl-containing polyphenylene oxide resin comprises a vinylbenzyl-containing polyphenylene oxide resin, and the second vinyl-containing polyphenylene oxide resin comprises a vinylbenzyl-containing polyphenylene oxide resin, a methacrylate-containing polyphenylene oxide resin, an allyl-containing polyphenylene oxide resin, a vinylbenzyl-modified bisphenol A polyphenylene oxide resin, a chain-extended vinyl-containing polyphenylene oxide resin or a combination thereof.

7. The resin composition of claim 1, wherein the first vinyl-containing polyphenylene oxide resin has a number average molecular weight of between 800 and 1400, and the second vinyl-containing polyphenylene oxide resin has a number average molecular weight of between 1800 and 3000.

8. The resin composition of claim 1, wherein the first vinyl-containing polyphenylene oxide resin comprises a structure of Formula (1-1):

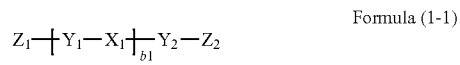

wherein b1 is a natural number of 0 to 2;

$X_1$ comprises a structure of any one of Formula (2) to Formula (4):

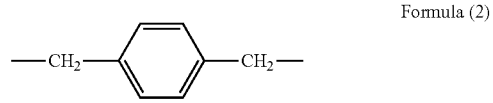

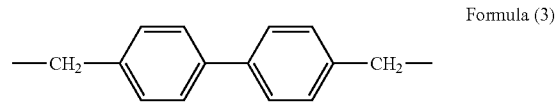 [SMILES: CCc1ccc(-c2ccc(CC)cc2)cc1]

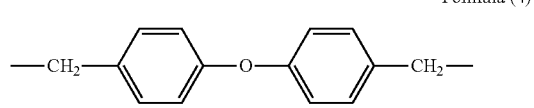

$Y_1$ and $Y_2$ individually comprise a structure of Formula (5-1):

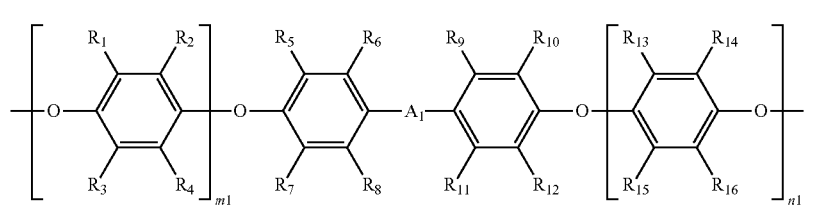

Formula (5-1)

wherein m1 and n1 independently represent an integer of 1 to 15; $R_1$ to $R_{16}$ are independently selected from H, —$CH_3$ and a halogen atom; and $A_1$ is selected from a covalent bond, —$CH_2$—, —$CH(CH_3)$—, —$C(CH_3)_2$—, —O—, —S—, —$SO_2$— and a carbonyl group; $Z_1$ and $Z_2$ individually comprise a structure of Formula (6-1):

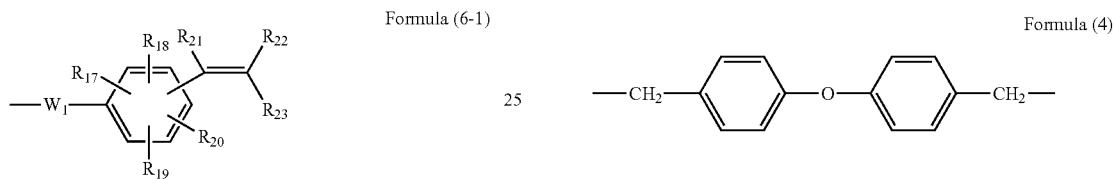

Formula (6-1)

wherein $R_{17}$ to $R_{23}$ are individually selected from H, —$CH_3$ and a halogen atom, and $W_1$ is a $C_1$ to $C_3$ bivalent aliphatic group.

9. The resin composition of claim 1, wherein the second vinyl-containing polyphenylene oxide resin comprises a structure of Formula (1-2):

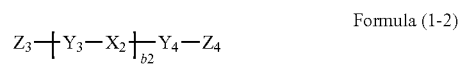

Formula (1-2)

wherein b2 is a natural number of 0 to 8;

$X_2$ comprises a structure of Formula (2) to Formula (4) or a combination thereof:

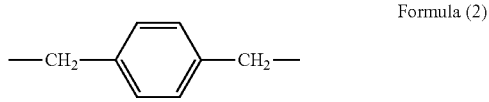

Formula (2)

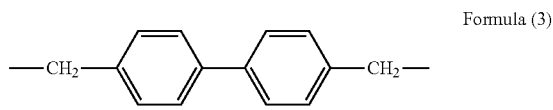

Formula (3)

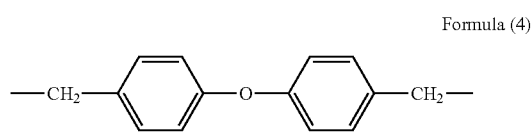 [SMILES: CCc1ccc(Oc2ccc(CC)cc2)cc1]

Formula (4)

$Y_3$ and $Y_4$ individually comprise a structure of Formula (5-2):

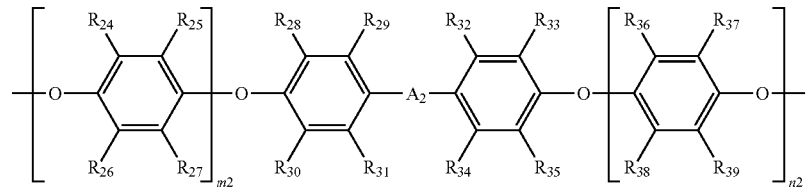

Formula (5-2)

wherein m2 and n2 independently represent an integer of 1 to 30; $R_{24}$ to $R_{39}$ are independently selected from H, —$CH_3$ and a halogen atom; $A_2$ is selected from a covalent bond, —$CH_2$—, —$CH(CH_3)$—, —$C(CH_3)_2$—, —O—, —S—, —$SO_2$— and a carbonyl group; $Z_3$ and $Z_4$ individually comprise a structure of Formula (6-2), Formula (6-3) or Formula (6-4):

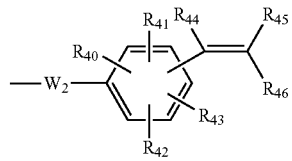

Formula (6-2)

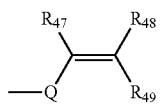

Formula (6-3)

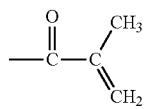

Formula (6-4)

wherein $R_{40}$ to $R_{49}$ are individually selected from H, —$CH_3$ or a halogen atom, and $W_2$ and Q are individually a $C_1$ to $C_3$ bivalent aliphatic group.

10. The resin composition of claim 1, further comprising an epoxy resin, another polyphenylene oxide resin, a cyanate ester resin, a small molecule vinyl compound, a maleimide resin, an acrylate, a phenolic resin, a benzoxazine resin, a styrene maleic anhydride, a polyolefin, a polyester resin, an amine curing agent, a polyamide resin, a polyimide resin or a combination thereof.

11. The resin composition of claim 1, further comprising flame retardant, inorganic filler, curing accelerator, solvent, silane coupling agent, coloring agent, toughening agent or a combination thereof.

12. An article made from the resin composition of claim 1, comprising a prepreg, a resin film, a resin film with copper foil, a laminate or a printed circuit board.

13. The article of claim 12, having a coefficient of thermal expansion of less than 35.0 ppm/° C. as measured with a thermomechanical analyzer by reference to IPC-TM-650 2.4.24.5.

14. The article of claim 12, having at least one of the following properties:

a T288 thermal resistance as measured by reference to IPC-TM-650 2.4.24.1 of greater than or equal to 70 minutes;

an interlayer bonding strength as measured by reference to IPC-TM-650 2.4.8 of greater than or equal to 2.85 lb/in; and a Z-axis dimensional change ratio as measured by reference to IPC-TM-650 2.4.24.5 of less than or equal to 1.80%.

* * * * *